United States Patent [19]

Lynch et al.

[11] Patent Number: 4,875,045

[45] Date of Patent: Oct. 17, 1989

[54] VARIABLE GAIN ENCODER APPARATUS AND METHOD

[75] Inventors: David L. Lynch, Kanata; Guy C. Quesnel, Nepean, both of Canada

[73] Assignee: Northern Telecom Limited, Montreal, Canada

[21] Appl. No.: 165,851

[22] Filed: Mar. 9, 1988

[51] Int. Cl.⁴ .............................................. H03M 1/18
[52] U.S. Cl. .................................... 341/139; 341/131; 341/136
[58] Field of Search ............... 341/127, 131, 136, 139, 341/143, 160

[56] References Cited

U.S. PATENT DOCUMENTS 3,936,819  2/1976  Angelle et al. ...................... 341/139
4,321,583  3/1982  Baron et al. ......................... 341/139
4,383,247  5/1983  Assard ................................. 341/139

Primary Examiner—William M. Shoop, Jr.
Assistant Examiner—Gary J. Romano
Attorney, Agent, or Firm—J. E. Moorehouse

[57] ABSTRACT

A variable gain analog to digital compression encoder apparatus and method is operational for 'on the fly' gain adjustments without introducing significant distortion or noise in telephone conversation. An incoming analog signal is fixed gain reproduced as a first stabilized mid-operating point analog signal. A second stabilized mid-operating point analog signal is produced in inverse proportion to the first stabilized mid-operating point analog signal, in response to a signal tapped along a signal division of a difference between the first and second signals. The second signal is compression encoded at a predetermined rate to produce pulse code modulated signal samples. The tap may be varied to change the encoding gain, at any time, in accordance with operating requirements of a telephone apparatus.

18 Claims, 3 Drawing Sheets

VARIABLE GAIN ENCODER APPARATUS AND METHOD

FIELD OF THE INVENTION

The invention is in the field of analog to digital encoders and more particularly relates to a telephony encoder with variable gain.

BACKGROUND OF THE INVENTION

Telephone systems of the digital signal type require analog to digital and digital to analog converter circuits, usually referred to as CODECs for interfacing voice signals and the like between analog signals compatible with analog transducers and binary signals compatible with digital telephony switching and transmission function and apparatus. In order that the encoding function be performed such that pulse code modulated (PCM) words are generated which accurately represent an analog input signal, the analog signal must be centered about an encoder midpoint. That is, the encoder operating midpoint and the zero level of the analog signal should correspond. If not, quantization distortion, harmonic distortion and noise are included in the PCM words. It is typical practice to have predetermined the gain of an encoder during manufacture, and if desired, later when in use, alter the gain, in circuit, with the use of a preset gain pad. Biasing of the midpoint may be conveniently achieved by AC coupling an appropriate node within the encoder and charging the node via a switched capacitor resistance to null any offset at the encoder input. In effect, the sign bit of each PCM word is integrated onto the AC coupled node such that its long term voltage (d.c. value) is representative of the average of the sign bit polarities. Stability is achieved when the sign bit occurrences are evenly negative and positive.

If however the gain of the typical encoder is changed during its normal operation, a step component consequently appears at the input of the encoder because the integrated signal at the AC coupled node no longer cancels the total offset. Hence, the operational midpoint is shifted to no longer correspond to the zero level of the analog signal. In a linear encoder the effect of a gain change will be manifest as an annoying click. In a compression encoder, severe harmonic distortion may also result. Given time, the step voltage diminishes until the operational midpoint again corresponds to the zero level of the analog signal. However, during this time resulting harmonic distortions deteriorate the quality of compression encoded signal. In an application wherein the gain of the encoder is adjusted from time to time, or frequently, such performance is unacceptable.

SUMMARY OF THE INVENTION

It is an object of the invention to provide a variable gain encoder whereby analog to digital signal conversions may be modified during the course of a telephone call.

It is also an object of the invention to provide an encoder, the gain of which may be abruptly varied 'on the fly', that is to say during an active telephone call, without introducing significant noise and distortion.

In accordance with the invention, a variable gain analog to digital encoder includes, a first fixed gain encoding path, which provides a first stabilized mid-operating point analog signal to a second variable gain encoding path wherein, an analog amplifier inversely amplifies a variably tapped difference signal developed between the first analog signal and a signal for encoding at an output of the analog amplifier in the second path.

An apparatus in accordance with the invention for variably encoding an analog signal to produce pulse code modulated (PCM) signal samples therefrom, comprises a first means for generating encoded signal samples, and a second means for generating variable gain encoded signal samples. The first means includes a first amplifier means, having an analog signal input port, and being for producing a first stabilized midoperating point analog signal in response the analog signal and to first sign bits, said first sign bit emanating from an analog to digital converter for generating the first sign bits in response to the first stabilized analog signal. The second means includes a second amplifier means for producing a second stabilized mid-operating point analog signal in proportional inverse relationship with the first stabilized analog signal and in response to second sign bits. A resistance means is connected to have a difference of the first and second stabilized analog signals appear there across, and includes a variable tap means which is connected to an inverting input of the second amplifier. The analog to digital converter generates the PCM signal samples, including the second sign bits, in response to said second stabilized analog signal.

An alternate gain method for generating digital word representations of an analog signal in accordance with the invention includes, providing a first signal in response to the analog signal and first sign bits corresponding thereto by stabilized mid-operating point amplifying the analog signal with a predetermined fixed gain. A second signal is provided in response to the first signal and second sign bits corresponding to the second signal by stabilized mid-operating point amplifying the first signal with a controllably varied gain. The second signal is digitally converted to provide plural bit words, each including one of said second sign bits, whereby said plural bit words are gain variable with respect to the first signal.

BRIEF DESCRIPTION OF THE DRAWINGS

An example embodiment is discussed with reference to the accompanying drawing in which.

DESCRIPTION OF THE EXAMPLE EMBODIMENT

Figure 1:
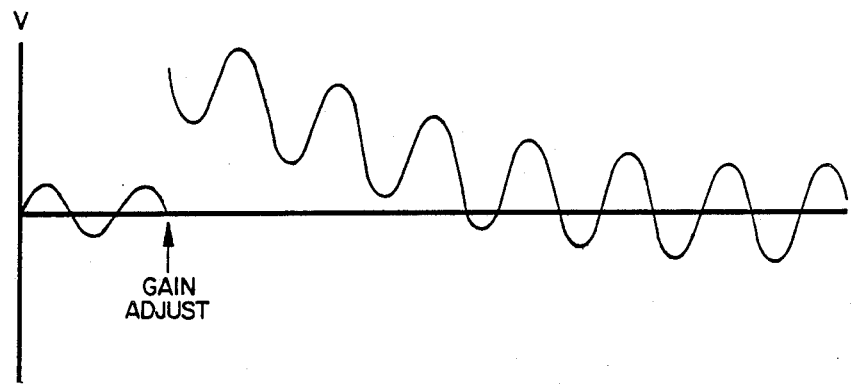
FIG. 1 is a graphical illustration of a reconstructed signal having been affected by a momentary gain adjustment in a prior art encoder.
Figure 2:
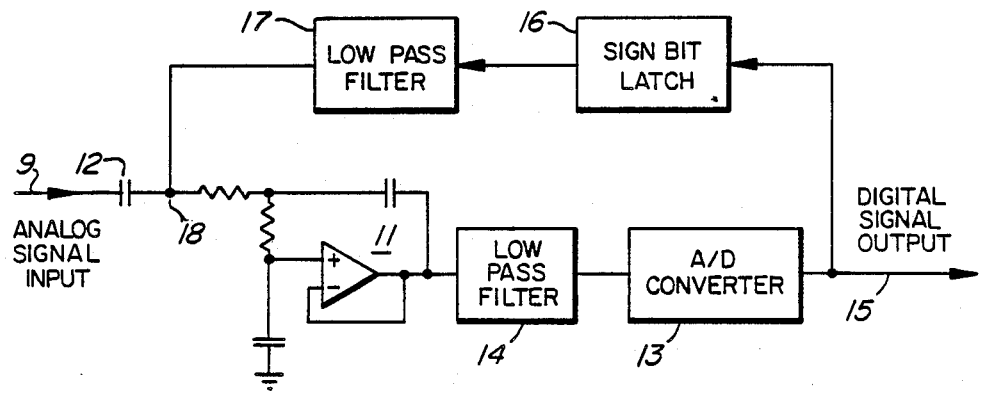
FIG. 2 is a schematic block diagram of a prior art encoder having predetermined fixed gain.

The graphical illustration in FIG. 1 includes a voltage axis V at a left side of the figure and a time axis T extending at right angles to the voltage axis V. A reconstructed analog representation of an encoded audio signal as might be obtained from the encoder in FIG. 2 is depicted along the time axis T. A first 1½ cycles on the left side of the figure represent an encoding function of a constant signal wherein the encoding function is of first gain. The remaining cycles represent an encoding function of the constant signal after the encoding function was abruptly changed or adjusted in the encoder circuit to a second gain, greater than the first gain. If gain changes are extreme, as might be the case if handsfree voice switching were required, the time for the signal to settle as depicted on the righthand side of the figure could be as much as a minute. Such performance would not be practical in a telephone system.

Figure 3:
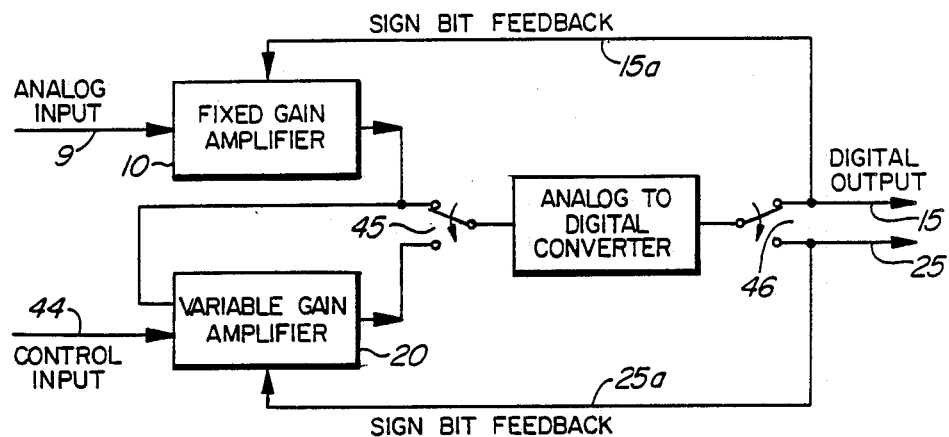
FIG. 3 is a schematic block diagram of a variable encoder circuit in accordance with the invention.
Figure 4:
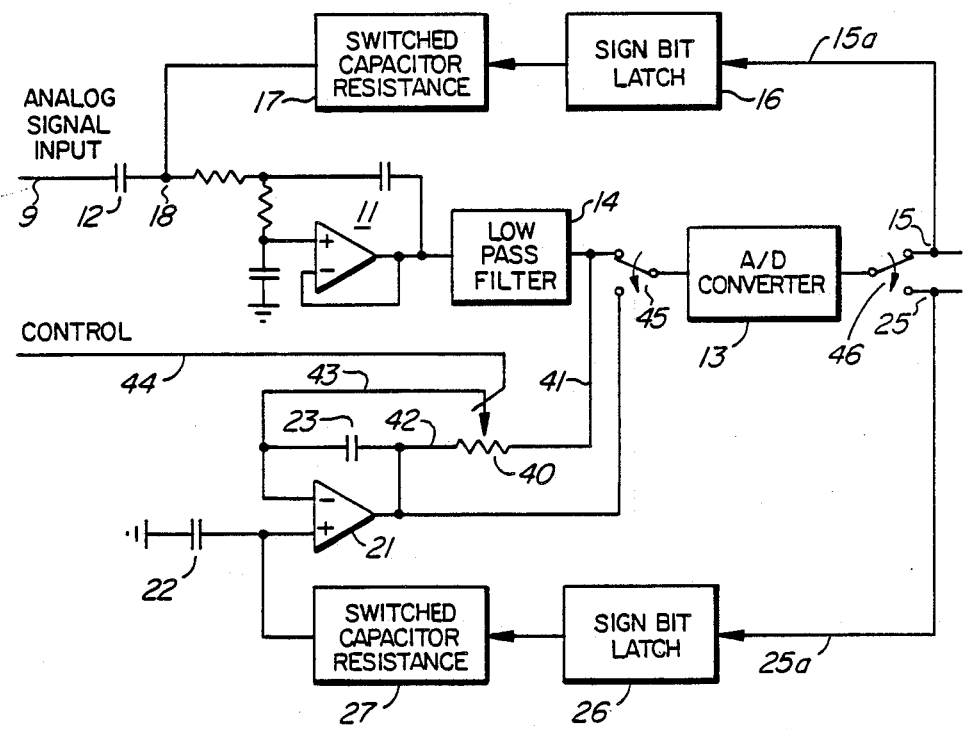
FIG. 4 is a more detailed schematic block diagram of an example of the variable encoder circuit illustrated in FIG. 3.

The typical encoder, illustrated in FIG. 2, is adapted as illustrated in FIGS. 3 and 4, the structure and functions of which may be more readily understood by first considering the prior art. In FIG. 2, an analog audio signal is applied at an audio input 9 and capacitively coupled via a capacitor 12 to a node 18 of a Butterworth second order filter circuit shown in detail at 11. A low pass filter 14, often referred to as an anti-aliasing filter, passes voice band frequencies to an input of an analog to digital converter circuit 13. In a typical telephony application, converter circuits are operated at a sampling rate of 8 Khz and the filter cut off characteristic is between 3 Khz and 4 Khz. The analog to digital converter circuit 13 generates plural bit words, usually 8 bit PCM words, at an 8 Khz rate in response to the analog signals from the low pass filter 14. A sign bit of each word defines the polarity of each word. The sign bit is also used to adjust the mid-operating point of the circuit 11 via the node 18, where, an integration of sign bit occurrences is coupled via a sign bit latch 16 and a switched capacitor functional resistance element at 17.

As thus far described, the prior art encoder circuit provides a fixed gain encoding function. The gain of this circuit may be altered, for example, by introducing resistance in a series with the inverting input of the amplifier 10. If the gain is altered during operation, for example during a telephone conversation, this will have the effect of disturbing the mid-operating point similar to that exemplified in FIG. 1. As before mentioned, frequent gain changes of this consequence would not be tolerable in a typical telephone system.

In FIG. 3, a fixed gain amplifier 10 is representative of all but the analog to digital converter 13 in FIG. 2. The analog to digital converter 13 in FIG. 3 is alternately connected to receive first and second analog signals from the fixed gain amplifier 10 and a variable gain amplifier 20, via a switch 45. An output of the converter circuit 13 is coupled by a switch 46 to provide digital outputs alternately on leads 15 and 25.

The converter 13 is operated in this example at a 16 Khz sampling rate, in synchronism with the switches 45 and 46. Signals from the output of the fixed gain amplifier 10 are inversely amplified in the variable gain amplifier 20 in accordance with a gain factor controlled via a control input 44. Both the amplifiers 10 and 20 are mid-operating point stabilized in response to sign bits coupled via respective paths 15a and 25a. Hence the sign bits on the path 15a are the inverse of the sign bits on the path 25a. In an another example, not shown, the switches 45 and 46 are not used and only the output of the variable gain amplifier is converted to a digital signal. In this example, the path 15a is connected directly to the path 25a but differs therefrom in that it includes an invertor in series therewith for inverting the sign bits on the path 25a for use in stabilizing the amplifier 10.

In FIG. 4, the variable encoder circuit illustrated includes all the elements of the prior art FIG. 2 (which are correspondingly labeled) in addition to elements which provide an example of the variable gain amplifier 20 in FIG. 3. With exception of the capacitor 12 and a capacitor 22, all of the elements in FIG. 4, are preferably integrated in CMOS transistor technology within an integrated circuit. In this example, low pass filters 17 and 27 are implemented by switched capacitor resistances. An operational amplifier 21 includes a non-inverting input which is used as a stabilizing node for mid-point operating bias potential. The bias potential is generated by the capacitor 22 and the switched capacitor resistance 27 in response to sign bits from a latch 26 which captures and holds sign bits from the digital output 25, at an 8 KHz sampling rate. A resistance element 40 is connected via a lead 41 to the output of the low pass filter 14 and via a lead 42 to an output of the amplifier 21. An inverting input of the amplifier 21 is capacitively connected to its output via a capacitor (of about 5pf) 23 and is also connected to the resistance element 40 by a variable tap 43. The tap is alterable by a control input shown at 44.

The output mid-point of the amplifier 11 is directly coupled through the filter 14 such that a potential difference between the output of the amplifier 11 and the amplifier 21 appears across the resistance element 40. The variable tap 43, when adjusted, travels through a d.c. potential difference which counter balances the d.c. output of the amplifier 20 such that it remains at about the preferred mid-point even during those periods shorter than the time constant of the integrating function of the elements 22 and 27.

Figure 5:
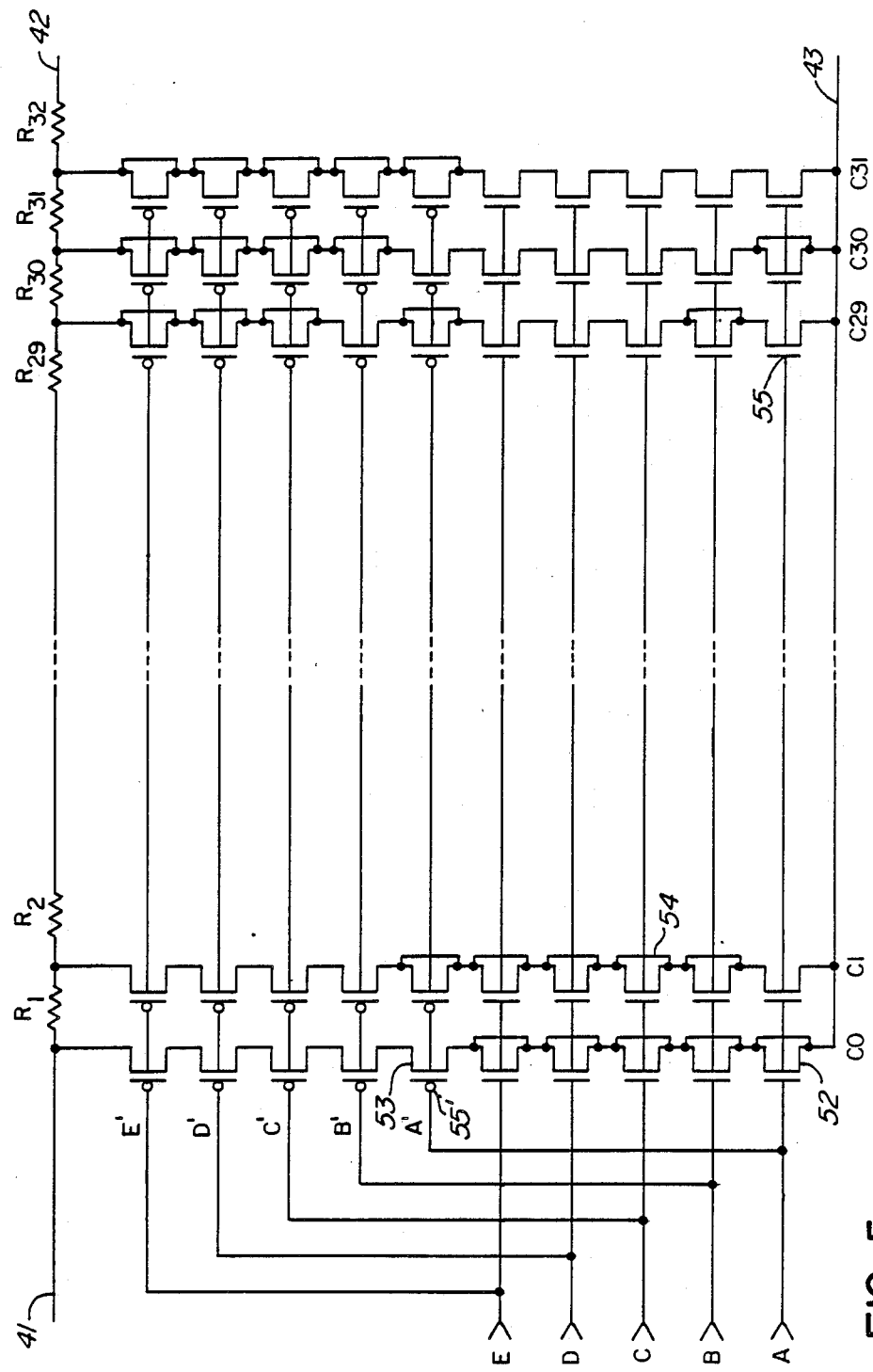
FIG. 5 is an abbreviated schematic diagram of one example of a gain adjustment element used an encoder circuit as illustrated in FIG. 4.

An example of the resistance element 40 is illustrated in more detail in FIG. 5. This example is particularly adapted to being integrated in the CMOS technology. Thirty-two columns labeled C0–C31 each include ten field effect transistors being arranged in a series string and terminating at a rail which corresponds to the variable tap 43. Thirty-two corresponding resistance segments, labelled R1–R32, are connected in series between the leads 41 and 42. The first column C0 is connected to a junction of the lead 41 and the resistance segment R1, and the second column C1 is connected to a junction between resistance segments R1 and R2 and so on as illustrated.

The control input 43 includes five leads labelled A-E, each of which is connected to gate electrodes, as exemplified at 55, of a pair of the field effect transistor (FET) in each of the columns and which are of opposite conductivity type. For convenience, this is illustrated by one of the pair having a gate electrode with an inversion symbol 55' attached.

For example, in column C0 a FET 52 is paired with a FET 53 which includes the inversion symbol. Both the FETs 52 and 53 include gate electrodes which are connected to the lead 43A but the FETs 52 and 53 respond oppositely to a control signal on the lead so that when one FET is OFF, the other is ON. For simplicity of illustration, the control leads are shown as running straight across each respective row. This is intended to indicate that the gate electrode of each of the FETs is connected to its respective control lead. It will be noticed that in each column, half of the FETs are each bridged by a conductive path, as exemplified at 54. The conductive paths or bridges are organized in a prearranged pattern such that only one of the columns C0–C31 will be switched ON in the presence of any five bit binary word applied at control input 44. More particularly in this pattern, one of each FET pair is bridged while the other is not, such that the bridged FET is of no function. Therefore, each of the leads A-E is of effect with respect to only one FET in each row even though it is connected to its respective pair of FETs in each row. This particular structure was arrived at as a matter of convenience in fabricating the example embodiment in the MOS technology.

In this particular example of the encoder in FIG. 4, the resistance element is so arranged to provide a gain alteration of 1.7 decibel steps through a range of 52.7 decibels.

We claim:

1. A gain controllable analog to digital (A/D) encoder for providing digital words being representative of samples of an input analog signal, comprising:
   an analog to digital converter circuit for generating said digital words each consisting of plural bits, including a sign bit;
   a first means for generating a fixed gain analog signal in response to the input analog signal, the first means being mid-operating point stabilized in response to the sign bits corresponding to the fixed gain analog signal; and
   a second means for supplying a variably controlled gain analog signal to the converter circuit in response to the stabilized mid-operating point fixed gain analog signal from the first means, the variably controlled gain analog signal from the second means being mid-operating point stabilized in response to the sign bits of the digital words.

2. An A/D encoder as defined in claim 1 wherein the variably controlled gain analog signal is supplied to the converter circuit from the second means in inverse relationship to the fixed gain analog signal generated by the first means.

3. An A/D encoder as defined in claim 1 wherein the second means is responsive to an externally supplied control signal for defining an amount of amplification in the second 4. An A/D encoder as defined in claim 3 wherein the externally supplied control signal is a plural bit binary word.

5. An A/D encoder as defined in claim 1 wherein the A/D converter circuit is a compression A/D converter circuit.

6. A gain controllable analog to digital (A/D) encoder for providing digital words being representative of samples of an input analog signal, comprising:
   an analog to digital converter circuit for generating said digital words each consisting of plural bits, including a sign bit;
   a first means for generating a fixed gain analog signal in response to the input analog signal, the first means being mid-operating point stabilized in response to the sign bits corresponding to the fixed gain analog signal;
   a second means for supplying a variably controlled gain analog signal to the converter circuit in response to and in inverse relationship to the stabilized mid-operating point fixed gain analog signal from the first means, the signal from the second means being midoperating point stabilized in response to inverted sign bits of the digital words; and
   invertor means for inverting the sign bits of said digital words to provide said inverted sign bits.

7. A gain controlled A/D encoder as defined in claim 1 further comprising:
   switches means for alternately coupling the fixed gain analog signal from the first means, and the variably controlled gain analog signal from the second means to the converter circuit at a fixed rate being at least twice that of a Niquist frequency; and
   wherein the converter circuit is operated at said fixed rate, whereby encoded samples of the signals from the first and second means are alternately available at an output of the converter circuit.

8. A gain controllable analog to digital (A/D) encoder for providing digital words being representative of samples of an input analog signal, comprising;
   an analog to digital converter circuit for generating said digital words each consisting of plural bits, including a sign bit;
   a first means for generating a fixed gain analog signal at an output thereof in response to the input analog signal, the first means being mid-operating point stabilized in response to the sign bits corresponding to the fixed gain analog signal;
   a second means having an output and an input, the record means for supplying a variably controlled gain analog signal to the converter circuit in response to the stabilized mid-operating point fixed gain analog signal from the first means, the variably controlled gain analog signal from the second means being mid-operating point stabilized in response to the sign bits of the digital words; and
   a voltage divider being connected between the outputs of the first and second means and including at least two voltage tap positions being selectively connectable to the input of the record means for coupling the analog signal from the first means thereto.

9. A gain controllable analog to digital (A/D) encoder for providing digital words being representative of samples of an input analog signal, comprising:
   an analog to digital converter circuit for generating said digital words each consisting of plural bits, including a sign bit;
   a first means for generating a fixed gain analog signal in response to the input analog signal, the first means being mid-operating point stabilized in response to the sign bits corresponding to the fixed gain analog signal; and
   a second means for supplying a variably controlled gain analog signal to the converter circuit in response to the stabilized mid-operating point fixed gain analog signal from the first means, the variably controlled gain analog signal from the second means being mid-operating point stabilized in response to the sign bits of the digital words;
   the second means comprising:
   a differential amplifier having an output for supplying said controlled gain analog signal and an inverting input; and
   a voltage divider being connected between the output of the first means and the output of the differential amplifier, and including a plurality of voltage tapable positions, one of which being connected to the inverting input.

10. An A/D encoder as defined in claim 9 wherein the voltage divider comprises a plurality of resistance segments and a plurality of corresponding switch means being connected between each of the segments and the inverting input.

11. An A/D encoder as defined in claim 10 wherein each of said switch means consists of a column of field effect transistor devices being connected row on row in common with corresponding gate control leads, the field effect transistor devices being arranged in opposite responsive combinations and being selectively bridged, such that a binary word being applied to said control leads causes one column to be of a much higher conductance than any of the other columns.

12. An A/D encoder as defined in claim 9 wherein the voltage divider is responsive in operation to n bit binary words, and comprises:

n leads for application of the binary words thereto, each of the n leads being connected to control $2^n$ switching devices, each of the $2^n$ switching devices being arranged in a corresponding column of at least n switching devices, each of said columns being connected between a common rail and a corresponding voltage tap of a segmented resistance rail having $2^n$ resistance segments connected in series between the output of the first means and the output of the differential amplifier in the second means, said common rail being connected to the inverting input of the differential amplifier.

13. A gain controllable analog to digital (A/D) encoder for providing digital words being representative of samples of an input analog signal, comprising:

an analog to digital converter circuit for generating said digital words each consisting of plural bits, including a sign bit; a first means for generating a fixed gain analog signal in response to the input analog signal, the first means being mid-operating point stabilized in response to the sign bits corresponding to the fixed gain analog signal; and a second means for supplying a variably controlled gain analog signal to the converter circuit in response to the stabilized mid-operating point fixed gain analog signal from the first means, the variably controlled gain analog signal from the second means being mid-operating point stabilized in response to the sign bits of the digital words; and one of the first and second means including an invertor being responsive to the sign bits of each of said digital words to provide said sign bits corresponding to the fixed gain analog signal.

14. An alterable gain method for generating digital word representations of an analog signal, comprising the steps of (a) stabilized mid-operating point amplifying at a predetermined fixed gain to provide a first signal in response to the analog signal and first sign bits correspond thereto;

(b) stabilized mid-operating point amplifying at a controllably varied gain to provide a second signal in response to the first signal and second sign bits corresponding to the second signal; and (c) analog to digital converting the first signal to provide at least the first sign bits and analog to digital converting the second signal to provide plural bit words each including one of said second sign bits, whereby said plural bit words are gain variable with respect to the first signal.

15. An alterable gain method for generating digital word representation of an analog signal as defined in claim 14 wherein the second signal is provided in inverse relationship to the first signal by inverse amplifying the first signal.

16. An alterable gain method for generating digital word representation of an analog signal as defined in claim 14 wherein the first signal is amplified with a gain being in accordance with an externally supplied control signal.

17. An alterable gain method for generating digital word representation of an analog signal as defined in claim 16 wherein the externally supplied control signal is a plural bit binary word.

18. An analog to digital encoder for providing plural digital words each word including a sign bit and being representative of samples of an input analog signal in a plurality of selectable gain relationships comprising;

analog to digital converter means for generating the digital words at a rate in excess of at least twice a Niquist frequency;

first and second sign bit paths;

switch means having first and second input terminals and being operable at said rate for alternately coupling an input of the analog to digital converter means for receiving first and second analog signals, and having first and second output means for alternately coupling sign bits corresponding to the first and second analog signals to first and second sign bit paths respectively;

a first amplifier circuit including an operational amplifier in a fixed gain non-inverting configuration including an input for receiving the analog signal and a node for receiving a mid-operating point bias potential and an output for providing the first signal being a fixed gain reproduction of the analog signal;

a second amplifier circuit including an operational amplifier including a node common with a non-inverting input of the operational amplifier for receiving a mid-point bias potential, an inverting input, and, an output for providing the second signal being a variable gain inverted reproduction of the first signal;

a low pass filter means having a frequency cut off characteristic being less than the Niquist frequency, and being connected between the output of the first amplifier circuit and the first input terminal of the switch means;

the first sign bit path being connected to the node of the first amplifier circuit and including means for generating the bias potential in response to polarities of occurrences of the first sign bits;

the second sign bit path being connected to the node of the second amplifier circuit and including means for generating the bias potential in response to polarities of occurrences of the second sign bits;

a resistance means being connected between a first junction of the low pass filter and the first input terminal, and a second junction of the output of the operational amplifier in the second amplifier circuit and the second terminal, the resistance means including a tap means being variable between at least two positions, the tap means being connected to the inverting input of the operational amplifier in the second amplifier means.

* * * * *